US005554061A

United States Patent [19]

Park et al.

[11] Patent Number: 5,554,061

[45] Date of Patent: Sep. 10, 1996

[54] METHOD FOR MAKING A VERTICAL RESONANT SURFACE-EMITTING MICRO-LASER

[75] Inventors: Hyo-Hoon Park; Min-Soo Park; Byeoung-Su Yoo, all of Daejeon, Rep. of Korea

[73] Assignee: Electronics & Telecommunications Research Institute, Daejeon, Rep. of Korea

[21] Appl. No.: 359,200

[22] Filed: Dec. 19, 1994

[30] Foreign Application Priority Data

Sep. 30, 1994 [KR] Rep. of Korea ...................... 94-25171

[51] Int. Cl.[6] .................................. H01J 9/12; H01J 9/18

[52] U.S. Cl. .................................. 445/28; 445/49; 372/46

[58] Field of Search ............................ 445/28, 49; 372/7, 372/46

[56] References Cited

U.S. PATENT DOCUMENTS

| | | | |
|---|---|---|---|
| 5,068,869 | 11/1991 | Wang et al. | 372/46 |
| 5,359,618 | 10/1994 | Lebby et al. | 372/46 |
| 5,392,307 | 2/1995 | Sugiyama et al. | 372/46 |

FOREIGN PATENT DOCUMENTS

| | | | |
|---|---|---|---|
| 83/01155 | 3/1983 | WIPO | 372/45 |

OTHER PUBLICATIONS

IEEE, ©1991, entitled "Vertical–Cavity Surface–Emitting Lasers: Design, Growth, Fabrication, Characterization" by Jack L. Jewell, J. P. Harbison, A. Scherer, Y. H. Lee, L. T. Florez (15 pages).

*Primary Examiner*—P. Austin Bradley
*Assistant Examiner*—Jeffrey T. Knapp
*Attorney, Agent, or Firm*—Antonelli, Terry, Stout & Kraus

[57] ABSTRACT

The present invention is a vertical resonant surface-emitting laser, and more particularly, a method for making a micro-laser that can be emitted to the upper surface of resonance structures by forming electrodes on the side surface of the resonance structures. By forming the electrodes injecting the current to the active layer on the side surface of resonators, the electrodes may be formed more easily on the fine micro-laser. Moreover, the current is more efficiently injected to the inside the active layer due to the side electrode surrounding an upper glass layer and emitter, and the laser may be operated even with a smaller start current, and serial resistance of the resonators may be reduced.

3 Claims, 3 Drawing Sheets

METHOD FOR MAKING A VERTICAL RESONANT SURFACE-EMITTING MICRO-LASER

BACKGROUND OF THE INVENTION

1. Field of the Invention

The present invention relates to a vertical resonant surface-emitting laser, and more particularly, it relates to a method for making a micro-laser that can be emit from to the upper surface of a resonator by forming an electrode on the side surface of the resonator.

2. Description of the Prior Art

In order to make a vertical resonant surface-emitting micro-laser, resonant layers of multiple structure on which active layers and glass layers are formed, are vertically etched to have an irregular structure, and electrodes are then formed on the surface of the protruded resonant layers.

However, it is difficult to form electrodes on the surface of the fine protruded resonant layers because of the irregularity due to such an etching. Moreover, in case of the micro-laser having a diameter of below 10 μm, since the region of the surface of the resonant layers that can contact the electrodes is small, it is necessary to perform a preuse process for making electrodes. As a result, a method is needed for making electrodes that can perform efficient current injection.

SUMMARY OF THE INVENTION

The present invention is made in an effort to solve the above problem.

It is an object of the present invention to provide a method for making an upper surface-emitting micro-laser that can facilitate the formation of electrodes and perform more efficient current injection.

In order to achieve this object, the method for making an upper surface-emitting micro-laser comprising the steps of:

- depositing a protective layer on a substrate formed of a compound and having a surface-emitting laser structure on which a lower glass layer, an active layer and an upper glass layer are serially formed, and forming a rear electrode on the bottom of the substrate;
- forming a fine resist pattern on the protective layer and performing a first ion etching on the protective layer and upper glass layer using the resist pattern as a mask;
- applying a metal all over the surface of irregular structures on which the first etching is performed and forming side electrodes on the side surface of protruding resonators by performing a second etching on the metal and active layer applied except on protruded portions;
- applying a thick polyimide layer to cover all the irregular structures for planarazation and removing partially the polyimide layer until a part of the side electrode is exposed, and then wiring an electrode on side surface of the exposed side electrode; and
- removing the photoresist layer and protective layer remaining on the protruded portions by an upper emission of the laser to open a top surface of the upper glass layer.

DETAILED DESCRIPTION OF THE PREFERRED EMBODIMENT

A preferred embodiment of the present invention will be now described in detail with reference to the accompanying drawings.

Figure 1:
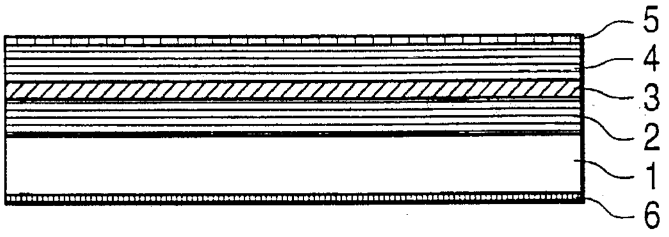
FIGS. 1 to 12 depict the steps in the manufacture of an upper surface-emitting micro-laser in accordance with a preferred embodiment of the present invention.

As shown in FIG. 1, a first step is a preparation for making a micro-laser, and a protective layer 5 is applied on a semiconductor substrate 1 formed of GaAs or InP type compound on which a lower glass layer 2, an active layer 3, and an upper glass layer 4 are formed. After that, a rear electrode 6 is formed on the lower portion of the semiconductor substrate 1.

The protective layer 5 for the protection of the surface on the upper glass layer 4 is formed of SiNx or $SiO_2$ to a thickness of 500 to 2000 angstroms.

n-type metal is applied on the rear electrode 5, and a quick heat treatment process is carried out for 20 to 60 minutes at a temperature of 320 to 450° C. to make ohmic contact.

Figure 2:
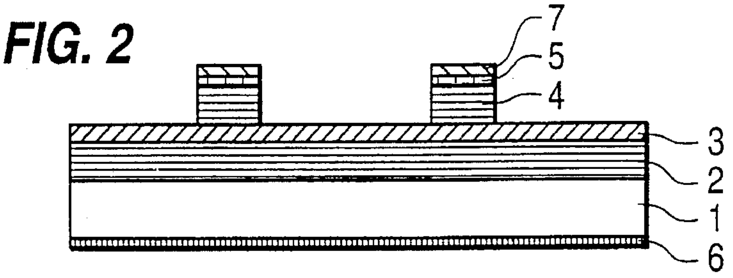

A second step is a first etching process to obtain an irregular structure for upper surface-emission of micro-laser. As shown in FIG. 2, a fine resist pattern 7 is formed on the protective layer 5 of FIG. 1 by means of photo-etching process. Using this resist pattern 7 as a mask, the protective layer 5 and upper glass layer 4 is etched by ion beam.

A third step is forming electrodes on the side surface of the resonance structure etched in the first step and then second etching the active layer 3.

Figure 3:
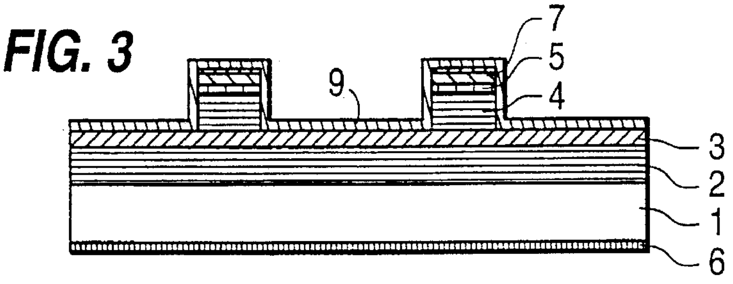

First, as shown in FIG. 3, Au having high albedo is deposited to a thickness of 500 to 2000 angstroms all over the irregular structures of FIG. 2.

So as to facilitate the deposition of the Au layer on the side surface of the protruding resonance structures by the first etching, the deposition is carried out slanted against the direction of deposition with a predetermined angle.

Figure 4:
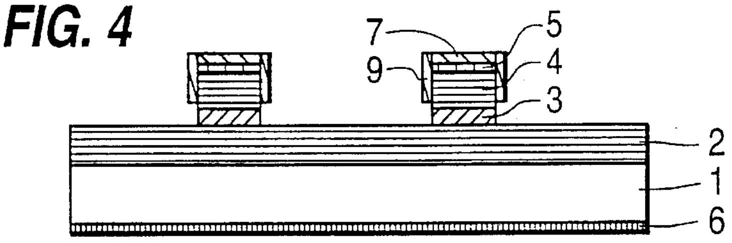

Referring now to FIG. 4, the active layer 3 and the Au layer of the active layer 3 are etched by ion beam with remaining the Au layer formed on the side surface of the resonance structures, remaining a side electrode 9, the resonance structures are electrically separated from each other. At this time, the ion beam at the time of performing the second etching is vertically irradiated all over the irregular structure to remain the Au layer 9 without being etched.

A fourth step is planarizing the resonance structures protruding through the above process.

Figure 5:
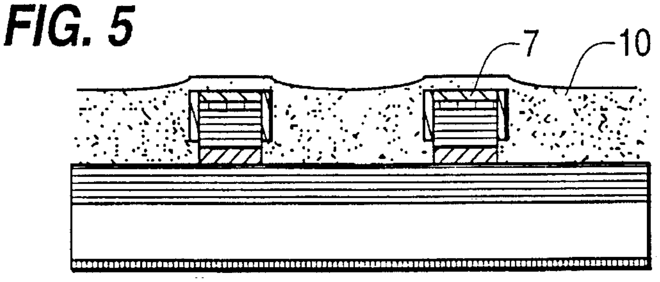
Figure 6:
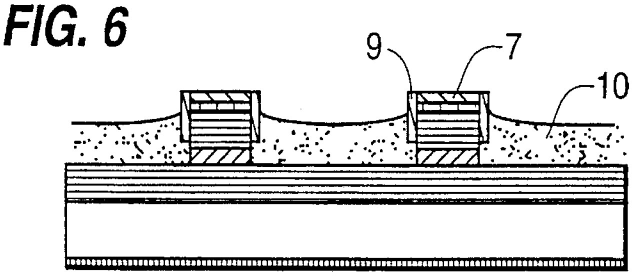

As shown in FIG. 5, after a thick film of polyimide is deposited to a thickness of 1 to 3 μm to cover all the irregular structure and heat treatment is carried out at a temperature of 200 to 350° C. to form a polyimide layer 10. The polyimide layer 10 is applied by high speed rotation to be thinner on the upper portion of the protruded portion than around the protruding portion. Referring now to FIG. 6, the front surface of the polyimide 10 is burned by an oxygen plazma method to expose partially the resist pattern 7 and side electrode 9.

Figure 7:
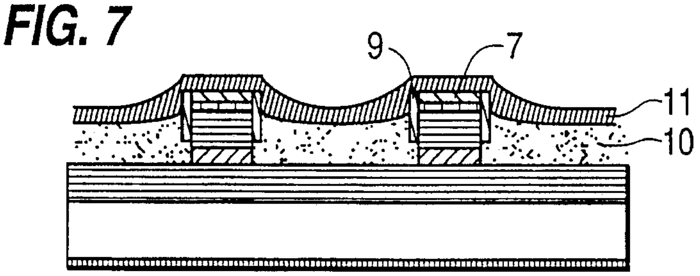

A fifth step is wiring the side electrode 9, and each sequence is depicted in FIGS. 7 to 100.

As shown in FIG. 7, a p-type Au layer 11 is deposited to a thickness of 1000 to 3000 angstroms all over the surface shown in FIG. 6. At the time of depositing the Au layer 11, the sample surface is slanted to the direction of deposition to facilitate contacting the side electrode 9.

Figure 8:
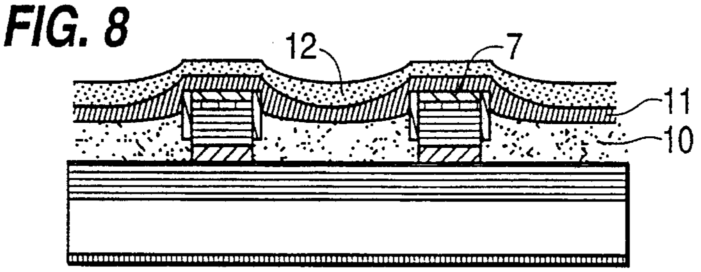
Figure 9:
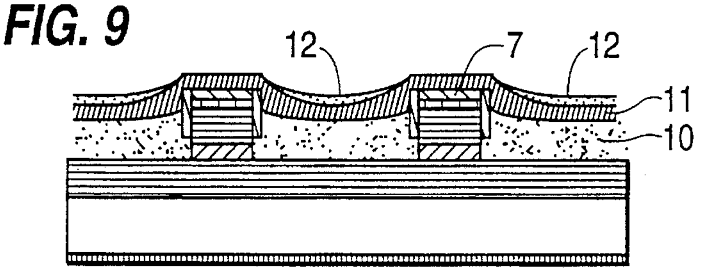
Figure 10:
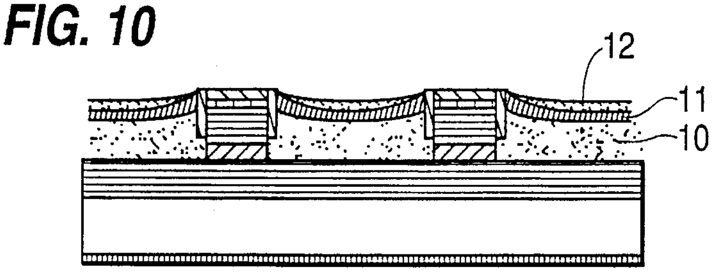

Subsequently, as shown in FIG. 8, a photoresist layer 12 is applied all over the surface in FIG. 7 by high speed rotation. The applied photoresist layer 12 is burned an by oxygen plazma method to expose just the Au layer 11 deposited on the protruding portions, as shown in FIG. 9. The Au layer 11 on the exposed protruding portions is removed by wet etching with KCN solution, as shown in FIG. 10.

Figure 11:
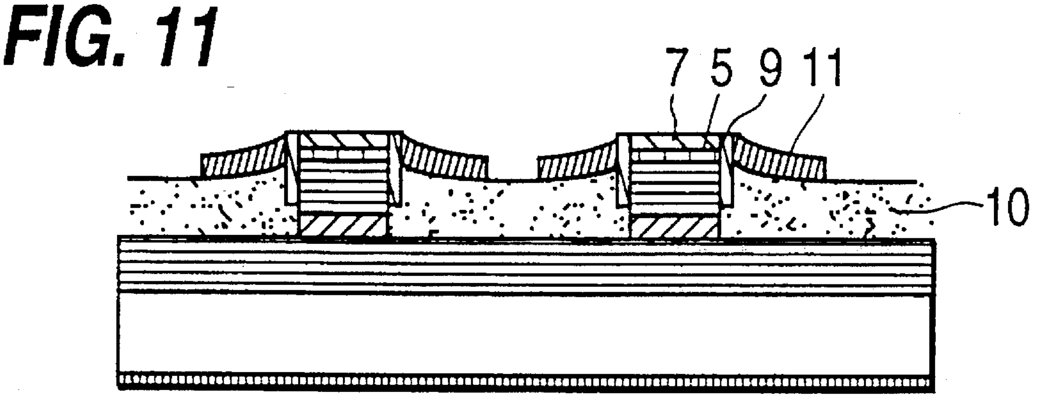

As shown in FIG. 11, the photoresist layer 12 is removed, and the p-type Au layer is patterned to form wiring electrodes 11.

A sixth step is forming a window through a laser is emitted, and the protective layer 5 and photoresist layer 7 formed on the upper glass layer 4 of the protruded portion, are removed.

Figure 12:
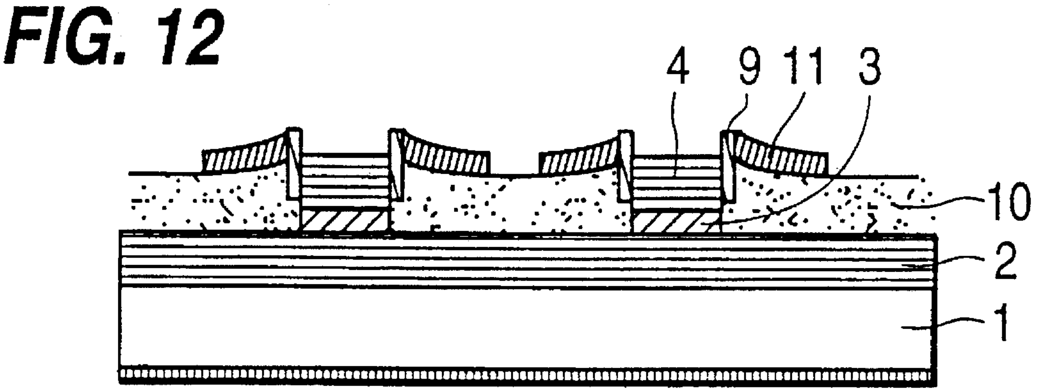

First, the photoresist layer 7 is removed by an oxygen plazma method, and the protective layer 5 is removed by reactive ion etching to form an upper surface-emitting micro-laser having side electrodes as shown in FIG. 12.

According to the present invention as mentioned above, by forming the electrodes injecting the current to the active layer on the side surface of the resonators, the electrodes may be formed more easily on the fine micro-laser. Moreover, the current is more efficiently injected to the inside the active layer due to the side electrode surrounding the upper glass layer, emitter, and the laser may be operated even with a smaller starting current, and serial resistance of the resonators may be reduced.

The side electrode is formed of Au having high albedo, and the laser beam is limited effectively to the inside of the resonance structures to enhance the output characteristics of the laser.

What is claimed is:

1. A method for making an upper surface-emitting micro-laser comprising the steps of:

depositing a protective layer on a substrate having a surface-emitting laser structure on which a lower glass layer, an active layer and an upper glass layer have been serially formed, and forming a rear electrode on a bottom of the substrate;

forming a resist pattern on said protective layer and forming resonance structures by performing a first ion etching on said protective layer and said upper glass layer using the resist pattern as a mask;

applying a metal all over surfaces of said resonance structures Ion which the first and forming side electrodes on a side surface of said resonance structures by performing a second etching on said metal and on said active layer except on said resonance structures;

applying a polyimide layer thick enough to cover all said resonance structures for planarazation and removing partially said polyimide layer until a part of said side electrodes is exposed, and then wiring the exposed electrodes on said side surface; and removing said polyimide layer and said protective layer remaining on said resonance structures by an upper emission of the laser to open a top surface of said upper glass layer.

2. The method according to claim 1, wherein said metal is deposited slanted at a predetermined angle so as to facilitate the formation of a metal layer on the side surface of said resonance structures to form said side electrodes.

3. The method according to claim 1 or 2, wherein said side electrodes are formed of Au having a high albedo to enhance the output characteristics of the laser by effectively limiting the laser beam within said resonance structures.

* * * * *